(12) United States Patent
Van Der Wiel

(10) Patent No.: US 10,586,772 B2
(45) Date of Patent: Mar. 10, 2020

(54) SENSOR SHIELDING FOR HARSH MEDIA APPLICATIONS

(71) Applicant: MELEXIS TECHNOLOGIES NV, Tessenderlo (BE)

(72) Inventor: Appolonius Jacobus Van Der Wiel, Duisburg (BE)

(73) Assignee: MELEXIS TECHNOLOGIES NV, Tessenderlo (BE)

( * ) Notice: Subject to any disclaimer, the term of this patent is extended or adjusted under 35 U.S.C. 154(b) by 0 days.

(21) Appl. No.: 15/882,073

(22) Filed: Jan. 29, 2018

(65) Prior Publication Data

US 2018/0218984 A1 Aug. 2, 2018

(30) Foreign Application Priority Data

Feb. 2, 2017 (EP) ..................... 17154442

(51) Int. Cl.
*H01L 23/552* (2006.01)
*H01L 29/45* (2006.01)
(Continued)

(52) U.S. Cl.
CPC ........... *H01L 23/552* (2013.01); *G01D 21/00* (2013.01); *H01L 21/76864* (2013.01);
(Continued)

(58) Field of Classification Search
CPC ... H01L 23/552; H01L 23/482; H01L 23/485; H01L 23/53252; H01L 21/76864;
(Continued)

(56) References Cited

U.S. PATENT DOCUMENTS

| 6,455,424 | B1 | 9/2002 | McTeer et al. |
| 2005/0280091 | A1 * | 12/2005 | Huang ................ H01L 27/0255 257/355 |

(Continued)

FOREIGN PATENT DOCUMENTS

EP 1760442 A2 3/2007

OTHER PUBLICATIONS

European Search Report from EP Application No. 17154442.2, dated Aug. 10, 2017.

*Primary Examiner* — Cuong B Nguyen
(74) *Attorney, Agent, or Firm* — Workman Nydegger

(57) ABSTRACT

A sensor device for use in harsh media, comprising a silicon die comprises a lowly doped region, and a contact layer, contacting the silicon die. The contact layer comprises a refractory metal and an ohmic contact to the silicon die via a silicide of the refractory metal. A noble metal layer is provided over the contact layer such that the contact layer is completely covered by the noble metal layer. The noble metal layer comprises palladium, platinum or a metal alloy of palladium and/or platinum. The noble metal layer is patterned to form an interconnect structure and a contact connecting via the contact layer to the ohmic contact. The noble metal layer is adapted for providing a shield to prevent modulation of the lowly doped region by surface charges. The noble metal layer may advantageously protect the contact layer against harsh media in an external environment of the sensor device.

18 Claims, 2 Drawing Sheets

(51) Int. Cl.
| | |
|---|---|
| H01L 29/06 | (2006.01) |
| H01L 23/522 | (2006.01) |
| H01L 23/532 | (2006.01) |
| H01L 23/00 | (2006.01) |
| H01L 21/768 | (2006.01) |
| H01L 29/84 | (2006.01) |
| H01L 23/485 | (2006.01) |
| G01D 21/00 | (2006.01) |
| H01L 29/8605 | (2006.01) |
| H01L 21/285 | (2006.01) |
| H01L 23/31 | (2006.01) |

(52) U.S. Cl.
CPC ........ *H01L 23/485* (2013.01); *H01L 23/5225* (2013.01); *H01L 23/5226* (2013.01); *H01L 23/53242* (2013.01); *H01L 23/53252* (2013.01); *H01L 23/53266* (2013.01); *H01L 24/03* (2013.01); *H01L 24/05* (2013.01); *H01L 29/0684* (2013.01); *H01L 29/456* (2013.01); *H01L 29/84* (2013.01); *H01L 29/8605* (2013.01); *H01L 21/28518* (2013.01); *H01L 23/3171* (2013.01); *H01L 23/3192* (2013.01); *H01L 2224/0345* (2013.01); *H01L 2224/03848* (2013.01); *H01L 2224/05664* (2013.01); *H01L 2224/05669* (2013.01); *H01L 2924/10253* (2013.01)

(58) Field of Classification Search
CPC ........... H01L 23/53266; H01L 23/5226; H01L 29/84; H01L 23/5225; H01L 24/05; H01L 29/0684; H01L 29/456; H01L 23/53242; H01L 2224/03848; H01L 2224/05664; H01L 2224/05669; H01L 21/28518; H01L 41/00–0536; H01L 41/08–1138; H01L 27/20; H01L 2924/13072–13076; G01D 21/00; G01N 27/414–4148

See application file for complete search history.

(56) References Cited

U.S. PATENT DOCUMENTS

2007/0015360 A1\* 1/2007 Lu ...................... H01L 21/0206
                                                                438/682
2011/0127674 A1   6/2011 Reinmuth et al.

\* cited by examiner

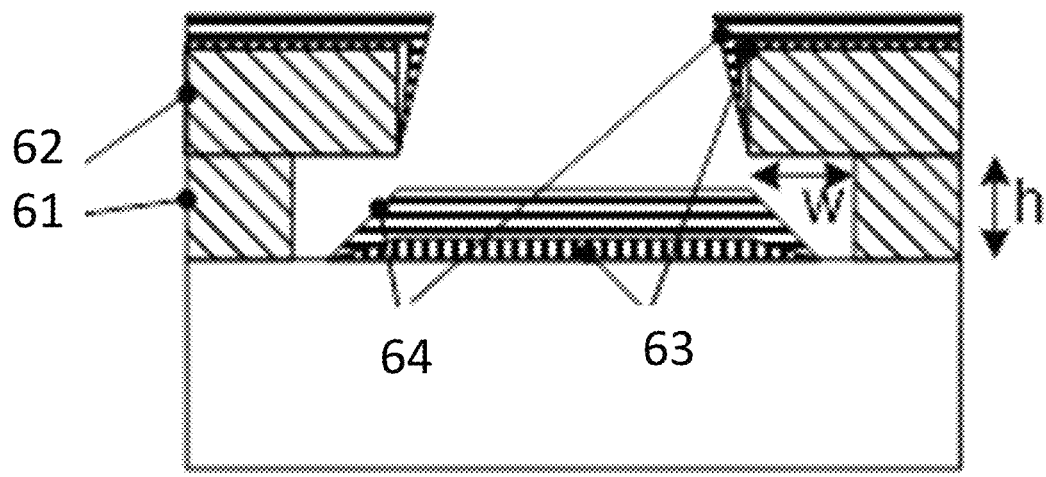
FIG 3
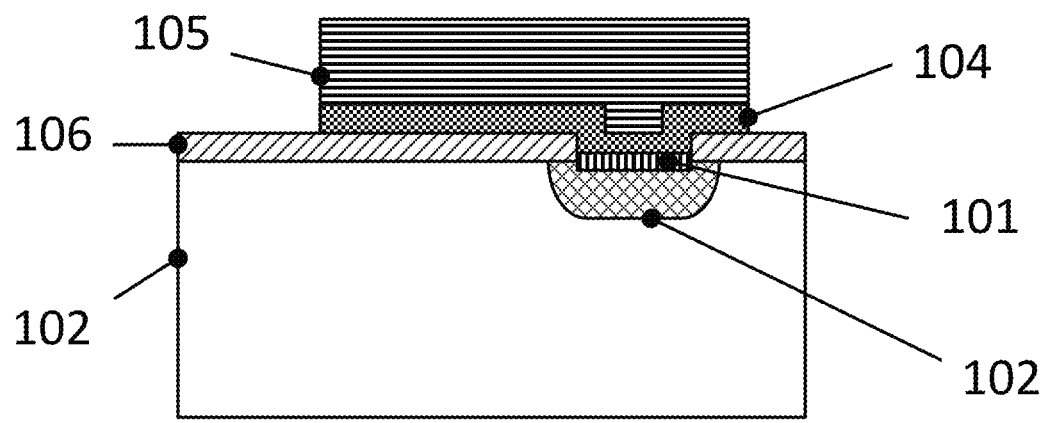
FIG 4 – PRIOR ART

SENSOR SHIELDING FOR HARSH MEDIA APPLICATIONS

FIELD OF THE INVENTION

The invention relates to the field of integrated semiconductor sensors for use in harsh media applications. More specifically it relates to a sensor device for use in harsh media and a related method for fabricating such sensor.

BACKGROUND OF THE INVENTION

Integrated sensor devices may require an electric shield provided above lowly doped diffusion areas, such as piezoresistive elements, implemented in a silicon die to obtain a good sensor stability, for example to prevent modulation of such piezoresistors by surface charges. It is known in the art to place a shield on top of passivation layers that cover lowly doped diffusion areas, such as piezoresistors. Since the shield is placed over the stress-sensitive lowly doped diffusion area, e.g. over a stress sensitive resistor, the shield should not add significant stress to the lowly doped diffusion area, nor a stress that changes over time. This could, for example, cause an undesirable offset in the measurements obtained from the sensor, which offset could moreover vary during the lifetime of the sensor.

For example, the shield is preferably implemented in a material that does not show significant plastic deformation at the stress levels it is exposed to during its lifetime, e.g. a material that does not exhibit plastic deformation under changing pressures, since a sensor offset could otherwise undesirably change after varying the pressure.

In standard CMOS processing techniques known in the art, silicon-titanium (Si—Ti) alloys can be used for providing a good ohmic contact between a silicon material and a metal, such as aluminium, while simultaneously preventing diffusion of that metal into the silicon material. For example, titanium may be sputtered onto the silicon, followed by a heating of the layer to form a Si—Ti alloy that has a low ohmic resistance. The Ti layer may furthermore be exposed to nitrogen to form a titanium nitride (TiN) layer on top of the titanium. For example, during the titanium sputtering, e.g. halfway during the sputtering process, nitrogen can be introduced in the sputter chamber to incorporate nitrogen into the upper part of the titanium film. This TiN layer can form a diffusion barrier and can also provide a good adhesion to a metal that is deposited on top of the contacts.

Standard CMOS processing techniques often comprise a very simple process sequence to achieve this. For example, after opening the contacts, the following process sequence can be performed: sputtering a Ti layer and forming a TiN layer on top of the Ti layer, e.g. using the same tool, annealing to form titanium silicide (Ti—Si) contacts, sputtering an interconnect layer, such as an Al, Al—Si, Al—Cu or Al—Si—Cu interconnect layer, on top of the TiN layer, patterning a photo resist on the metal stack, e.g. in which the contacts are covered with resist, etching the metal stack including the interconnect layer, the TiN layer and the Ti layer, and stripping the resist.

This approach provides, advantageously, important features without adding further photolithographic steps, e.g. provides ohmic contacts, an adhesion layer and a diffusion barrier in an efficient standard CMOS process sequence. For example, FIG. 4 schematically shows a prior-art standard CMOS contact with a Ti—Si layer 101 for assuring a low ohmic contact to the silicon, e.g. to a (p or n) diffusion region 102 in a silicon substrate 103, e.g. an n-bulk silicon slab. Furthermore, a TiN layer 104 provides a diffusion barrier, while providing the electrical connection to an interconnect structure 105, e.g. a copper or aluminium interconnect. Furthermore, a passivation layer 106, e.g. a silicon oxide $SiO_2$ layer that delineates the silicon contact area is shown.

Standard CMOS devices may be less suitable, e.g. may be unsuitable, for use in harsh media conditions, e.g. under exposure to sulfuric or fuming nitric acids or to iodine. For example, bondpad metals, such as aluminium or copper, may corrode, e.g. due to oxidation, when exposed to such chemicals. It is known in the art to cover the bondpads by a protective gold layer. However, a diffusion barrier may need to be provided in between the bondpad and the gold. For example, without a diffusion barrier, aluminium and gold may easily and rapidly diffuse into each other, which may be even more problematic in high temperature applications. Providing a protective gold layer on the device allows to maintain the advantages of standard CMOS processing in a device for harsh media conditions, such as an efficient volume production and a good electrical contact between the interconnect metal and sensing elements in the silicon.

It is known in the art to deposit gold onto an aluminium bondpad by electroless plating, e.g. first a layer of nickel is grown on the aluminium bondpad, followed by electroless plating of a thin gold layer. The nickel may then form a suitable diffusion barrier. However, while the layers provided on the bondpad by an electroless plating method may firmly adhere to the bondpad metal, no mechanical connection is realized between the protective layers and the passivation around the bondpad. This has the disadvantage that chemicals, such as the aforementioned chemicals that can be present in harsh media, may penetrate the interface between the passivation and the plated metals and corrode the bondpad metal.

When gold is deposited by electroplating, the seedlayer also acts as a diffusion barrier and as an adhesion layer. It is furthermore known in the art to first sputter Ti or TiW to provide an adhesion and diffusion barrier, followed by sputtering a highly conductive layer, such as gold or copper, to allow high plating currents.

However, after the electroplating of the gold on the bondpads, the seedlayer needs to be etched away to assure that no electrical connection between different structures remains, such that the edge of the seedlayer at the bottom of the gold structure is exposed to the environment, e.g. to the aforementioned corrosive chemicals in a harsh media application. It is known to apply an additional organic protection layer after etching the seedlayer to cover the exposed edge of the seedlayer. However, such protection layers may have a poor adhesion to gold, and corrosive chemicals may yet penetrate the interface between the protection layer and the gold metal.

Another disadvantage of known strategies in which the bondpads are covered with gold is that standard CMOS passivation is relied upon to protect the interconnect, e.g. the aluminium or copper interconnect. This passivation may however be insufficient to block the aforementioned corrosive chemicals. For example, particularly iodine may tend to completely remove aluminium wires when only one small defect, e.g. a small pinhole, is present in the passivation layer covering the interconnect.

SUMMARY OF THE INVENTION

It is an object of embodiments of the present invention to provide good and efficient fabrication of sensors comprising a lowly doped diffusion area, such as a piezoresistive element, for use in a harsh media environment.

It is an advantage of embodiments of the present invention that a cost effective method of fabricating sensors comprising stress-sensitive regions, such as low doped diffusion areas, suitable for use in harsh media applications, is achieved.

It is an advantage of embodiments of the present invention that a cost effective method of fabricating sensors based on piezoresistive transduction, suitable for use in harsh media applications, is achieved.

It is an advantage of embodiments of the present invention that only a single noble metal layer deposition, e.g. a single layer comprising a noble metal, can be sufficient to fabricate a sensor, e.g. such as to require only a single process step that is a not a standard CMOS compatible process step. It is a further advantage that processing costs can be low, and/or fabrication runs can be performed in high volumes.

It is an advantage of embodiments of the present invention that contacts, bondpads, interconnects and shields can be implemented in a single noble metal layer.

It is an advantage of embodiments of the present invention that a low ohmic contact can be implemented from a noble metal layer, e.g. comprising interconnects and/or bondpads, via an intermediate contact layer to the silicon. For example, the intermediate contact layer and its associated silicide may prevent adverse effects of a schottky contact between the noble metal layer, e.g. comprising platinum, and the silicon. For example, a non-linear resistance of such schottky diode could complicate or prevent obtaining a useful signal from the sensor, e.g. from a contacted piezoresistive element.

It is an advantage of embodiments of the present invention that a surface, including edges of metal structures, of the sensor device can be highly resistant against harsh media. For example, the use of aluminium or copper interconnects, which are highly sensitive to corrosion by harsh media, can be avoided. Furthermore, additional passivation of the interconnect structure may not be required in accordance with embodiments of the present invention.

The above objective is accomplished by a method and device according to the present invention.

In a first aspect, the present invention relates to a sensor device for use in harsh media, the sensor element comprising a silicon die comprising a lowly doped region, a contact layer contacting the silicon die, in which the contact layer comprises a refractory metal and an ohmic contact to the silicon die via a silicide of the refractory metal, and a noble metal layer provided over the contact layer such that the contact layer is completely covered by the noble metal layer.

The noble metal layer comprises palladium, platinum or a metal alloy of palladium and/or platinum. The noble metal layer is patterned to form an interconnect structure and a contact connecting via the contact layer to the ohmic contact. The noble metal layer is adapted for providing a shield for preventing modulation of the lowly doped region by surface charges. In other words, the noble metal layer comprises a shield that is electrically isolated from the lowly doped region, in which this shield is adapted for preventing modulation of the lowly doped region by surface charges.

For example, the contact layer may be completely covered by the noble metal layer, e.g. such that no part of the contact layer is left unexposed, e.g. such that no part of the sidewalls or of the top surface of the contact layer are left unexposed.

For example, the contact layer may be directly covered by the noble metal layer, e.g. such that the noble metal layer is directly in contact with and covering the contact layer. The contact layer may comprise a diffusion barrier, e.g. the contact layer may act as a diffusion layer, or part of the contact layer may be adapted for acting as a diffusion barrier, e.g. may be purposefully modified during manufacture to act as such diffusion barrier.

The sensor device may also comprise a diffusion barrier forming a surface interface between the noble metal layer and the contact layer. The diffusion barrier may be a separately formed layer, or may be integrally formed in manufacturing the contact layer. For example, the diffusion barrier may be formed as an integral part of the contact layer that contacts the noble metal layer. The silicide and the diffusion barrier may both be integrally formed in manufacturing the contact layer, e.g. by thermally annealing a sputtered titanium contact layer under nitrogen exposure to form a titanium-silicide contact at the bottom of the contact layer and a titanium-nitride diffusion barrier at the top of the contact layer.

In a sensor device in accordance with embodiments of the present invention, the contact layer and/or the diffusion barrier may be arranged such as not to cover, e.g. neither directly nor indirectly, the lowly doped region.

In a sensor device in accordance with embodiments of the present invention, the noble metal layer may be treated to acquire low stress and minimum creep.

In a sensor device in accordance with embodiments of the present invention, the noble metal layer may be patterned to define a bondpad.

In a sensor device in accordance with embodiments of the present invention, the refractory metal may comprise titanium, tungsten, molybdenum and/or tantalum.

A sensor device in accordance with embodiments of the present invention may comprise a diffusion barrier forming a surface interface between the noble metal layer and the contact layer.

In a sensor device in accordance with embodiments of the present invention, the refractory metal may be titanium, the silicide may be titanium silicide and the diffusion barrier may comprise titanium nitride and/or titanium-tungsten.

A sensor device in accordance with embodiments of the present invention may comprise at least one insulation layer that comprises silicon oxide and/or silicon nitride, in which the at least one insulation layer may be provided in between the lowly doped region and the noble metal layer.

In a sensor device in accordance with embodiments of the present invention, the contact hole may be provided through the at least one insulation layer for connecting the noble metal layer via the contact layer and the silicide to a highly doped region in the silicon die.

In a sensor device in accordance with embodiments of the present invention, the contact layer may comprise a continuous area overlapping and completely covering the contact hole.

In a sensor device in accordance with embodiments of the present invention, the continuous area of the contact layer may be smaller than an area footprint of the highly doped region in a plane parallel to the silicon die.

In a second aspect, the present invention relates to a method for fabricating a sensor element for use in harsh media. The method comprises providing a semiconductor die comprising a lowly doped region and a highly doped region, covering the semiconductor die by at least one insulation layer comprising silicon oxide and/or silicon nitride, etching a contact hole through the at least one insulation layer, e.g. the insulation layer or each of the at least one insulation layer, to expose at least part of the highly doped region, depositing a contact layer comprising a refractory metal on the exposed highly doped region, forming a silicide of the refractory metal between the contact layer and the silicon of the highly doped region to provide an ohmic contact to the silicon die, depositing a noble metal layer over the contact layer such that the contact layer is completely covered by the noble metal layer, in which the noble metal layer comprises palladium, platinum or a metal alloy of palladium and/or platinum, and patterning the noble metal layer to form an interconnect structure and a contact connecting via the contact layer to the ohmic contact, such that the patterned noble metal layer forms a shield to prevent modulation of the lowly doped region by surface charges.

A method in accordance with embodiments of the present invention may comprise forming a diffusion barrier on the contact layer after deposition of the contact layer or during the formation of the silicide.

In a method in accordance with embodiments of the present invention, the contact layer may be patterned before deposition of the noble metal layer, such that a continuous area of the contact layer remains that overlaps the contact hole and such that this continuous area of the contact layer is smaller than an area footprint of the highly doped region in a plane parallel to the silicon die.

In a method in accordance with embodiments of the present invention, patterning the noble metal layer may comprise applying a lift-off process.

In a method in accordance with embodiments of the present invention, patterning the noble metal layer may comprise applying an electroplating process.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

FIG. 3 schematically illustrates a lift off process for fabricating a stack of an adhesion material and a noble metal, such that the noble metal covers the adhesion material at the edges, for use in a method in accordance with embodiments of the present invention.

FIG. 4 shows a prior art metal silicide contact as known in the art.

Figure 1:
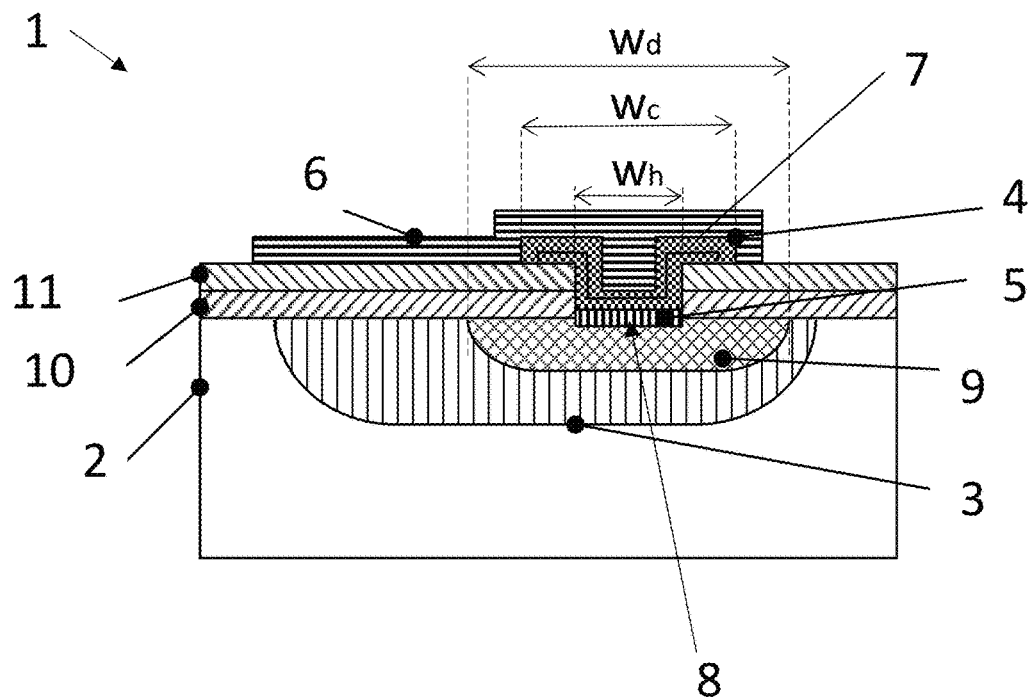
FIG. 1 shows an exemplary sensor device in accordance with embodiments of the present invention.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in present description reference is made to "lowly doped," this may refer to a typical concentration in the range of $1.10^{15}$ to $1.10^{19}$ cm$^{-3}$. With the term "highly doped," a typical concentration in the range of $1.10^{19}$ to $1.10^{22}$ cm$^{-3}$ may be intended. A lowly doped region may be particularly may be susceptible to mechanical stresses, e.g. may be particularly suitable for piezoresistive readout.

In a first aspect, the present invention relates to a sensor device for use in harsh media applications. The sensor device comprises a silicon die that comprises a lowly doped region, e.g. forming a piezoresistive element. The sensor device further comprises a contact layer contacting the silicon die, in which the contact layer comprises a refractory metal and an ohmic contact to the silicon die formed via a silicide of the refractory metal. The sensor device also comprises a noble metal layer provided over the contact layer such that the contact layer is completely covered by the noble metal layer, in which this noble metal layer comprises palladium, platinum or a metal alloy of palladium and/or platinum. The noble metal layer is patterned to form an interconnect structure and a contact connecting via the contact layer to the ohmic contact. The noble metal layer is also adapted for providing a shield for preventing modulation of the lowly doped region, e.g. of the piezoresistive element, by surface charges.

Referring to FIG. 1, an exemplary sensor device 1 in accordance with embodiments of the present invention is shown. For example, the sensor device may be a silicon integrated circuit sensor, such as a pressure sensor, a chemical sensor, a biochemical sensor, an accelerometer or a gyroscope. Particularly, the sensor device may be adapted for providing a signal representative of a physical quality based on a relation between the physical quality and a piezoresistive effect occurring in the sensor device. For example, the sensor device may be a chemical or biochemical sensor, in which the noble metal layer may be particularly suitable for defining electrode elements.

The sensor device 1 is furthermore adapted for use in harsh media applications, for example suitable for operation, e.g. prolonged and/or durable operation, under exposure to corrosive fluids, such as sulfuric or fuming nitric acids or to iodine.

The sensor device 1 comprises a silicon die 2. For example, the silicon die 2 may comprise a silicon substrate, such as a p-type or an n-type bulk silicon substrate.

The silicon die 2 comprises a lowly doped diffusion region 3, e.g. to form a piezoresistive element for sensing a physical quality. For example, such piezoresistive element may comprise a diffuse p-well in the n-type bulk, or likewise a diffuse n-well in the p-type bulk.

A piezoresistor may for example comprise the lowly doped region 3, e.g. a lowly doped p-type region with high piezoresistivity, e.g. the diffuse p-well, and may also comprise a highly doped p-type region with much lower piezoresistivity, e.g. the highly doped region 9. For example, in a pressure sensor, the lowly doped region may be defined on a membrane edge where the stress can vary most as function of the applied pressure. The highly doped region, e.g. a pair of highly doped regions, may provide the connection to the lowly doped region with high piezoresistivity, e.g. providing the contact to the interconnect. It is an advantage of such highly doped region that a good metal contact can be formed. A contribution of the highly doped region(s) to the total piezoresistance may be kept small, e.g. typically less than 10%.

The sensitivity to parasitic stress in the highly doped region may be less than for the lowly doped region, especially when the current is substantially flowing parallel to the <100> directions of the silicon crystal. On the other hand, the current may be substantially flowing parallel to the <110> directions of the silicon crystal for the lowly doped region in order to maximize sensitivity in that region.

The silicon die 2 may comprise a highly doped region 9, e.g. a highly p-doped or highly n-doped region, e.g. a p++ diffusion region. This highly doped region 9 may form a signal contact interface for obtaining a signal representative of a resistance of a piezoresistive element. Furthermore, a plurality, e.g. two, highly doped regions may be provided to form a signal contact interface to the piezoresistive element, e.g. to the lowly doped region 3. It shall also be clear to the person skilled in the art that a silicon die in a sensor device in accordance with embodiments of the present invention may comprise a plurality of piezoresistive elements, and a plurality of highly doped regions.

The sensor device 1 may also comprise at least one insulation layer 10,11 that comprises silicon oxide and/or silicon nitride, for example a silicon dioxide $SiO_2$ layer 10 on the silicon die and a silicon nitride $Si_3N_4$ layer on the silicon dioxide layer 11. The at least one insulation layer may thus comprise a stack of insulation layers, e.g. a stack consisting of a silicon dioxide layer and a silicon nitride layer.

The at least one insulation layer may be provided in between the lowly doped region 3 and the noble metal layer 6. A contact hole may be provided through the at least one insulation layer 10, 11 for connecting the noble metal layer via the contact layer and the silicide to a highly doped region 9 in the silicon die. For example, the contact hole may have a predetermined diameter or width $w_h$, e.g. a characterizing dimension of the hole in a plane parallel to a major plane of the semiconductor die.

The sensor device further comprises a contact layer 4 contacting the silicon die, in which the contact layer comprises a refractory metal and an ohmic contact 8 to the silicon die 2 formed via a silicide 5 of the refractory metal of the contact layer. The contact layer 4 may act as an adhesion layer for adhering the noble metal layer to the silicon die. The contact layer 4 may form a metallised contact for electrically contacting a highly doped region 9 of the semiconductor die.

The contact layer 4 may overlap and completely cover the contact hole, e.g. the contact layer may comprise a continuous area of the contact layer completely covering the contact hole, for example the continuous area covering the contact hole may have a predetermined diameter or width $w_c$, e.g. a characterizing dimension of the area of the contact layer covering the hole in a plane parallel to a major plane of the semiconductor die, that is larger than the predetermined diameter or width $w_h$ of the contact hole. Thus the contact layer may cover the contact hole and extend over the edge of the contact hole in all directions in the plane. This continuous area may refer to a continuous subsection of the contact layer 4 that is contiguous to the contact hole. For example, the contact layer may comprise a plurality of such subsections, e.g. disjunct subsections, each covering a corresponding contact hole of a plurality of contact holes in the insulation layer(s).

Furthermore, the predetermined diameter or width $w_c$ of the continuous area of the contact layer covering the contact hole may be smaller than a predetermined diameter or width $w_d$ of the highly doped region 9 in the silicon die. For example, the contact hole may be provided through the at least one insulation layer 10,11 for connecting the noble metal layer via the contact layer and the silicide to the highly doped region 9, and the contact hole may be covered with the continuous area of the contact layer, in which the contact hole is an opening in the insulation layer(s) that is smaller than the continuous area of the contact layer, and in which the continuous area of the contact layer is smaller than an area of the highly doped region. This relation refers to areas of the hole, of the continuous area of the contact layer and of the highly doped region as viewed in a parallel projection of the corresponding features onto a plane parallel to the semiconductor die, e.g. to a major plane of the semiconductor die. Likewise, the area of the contact hole may be fully contained within the circumference of the continuous area of the contact layer in that parallel projection, and the continuous area of the contact layer may be fully contained within the circumference of the area of the highly doped region in that parallel projection.

The sensitivity to parasitic stress in the highly doped region 9 may be less than for the lowly doped region 3, especially when a current is substantially flowing parallel to the <100> directions of the silicon crystal. When local stress is applied to the area of the highly doped region, the total piezoresistance may not show a significant change. Thus, if the contact layer 4 shows significant stress, the piezoresistance may not be significantly affected, e.g. sufficiently to adversely influence the usability of the sensor device, if the continuous area of the contact layer around the contact hole is inside the pattern of the highly doped area where the contacts are realised.

The refractory metal may be a refractory metal used in standard CMOS processing. For example, the contact layer may comprise a refractory metal such as W, Ti, TiW, TiN, Co, Ni, Mo, Ta or Pd.

The silicide 5 may be arranged between the contact layer and a highly doped silicon region 9, e.g. a p++ diffusion. For example, the silicide 5 may be formed by a heat treatment.

The ohmic contact 8, e.g. a metallic silicon contact, may be formed by the silicide 5 and the refractory metal of the contact layer. It is an advantage that such metallic silicon contacts can be fabricated using standard CMOS processing techniques.

For example, the metal of the contact layer may be titanium, and the silicide 5 may thus be a titanium silicide. The contact layer may for example substantially consist of the refractory metal, e.g. may consist of the refractory metal except for silicon diffused into the metal and/or except a surface barrier layer formed for preventing diffusion of the refractory metal into other layers than the silicon, e.g. to prevent diffusion of the refractory metal into the noble metal layer 6.

For example, the contact layer may be obtained by sputtering the refractory metal, e.g. Ti, onto the silicon die, to form a contact layer with good adhesive properties. Furthermore, different metals may be stacked, for example by two or more sputter steps with different metals, to stack a diffusion barrier layer 7 on top of the adhesive contact layer. However, the diffusion barrier 7 may also be formed on or in the contact layer in a single deposition. For example, a TiN diffusion barrier may be formed on top of a Ti adhesion layer by adding a nitrogen plasma while sputtering, e.g. after initially sputtering without such added nitrogen plasma, e.g. during a second half of the titanium sputtering. Alternatively, the titanium may be sputtered and the layer may be exposed afterwards to nitrogen at high temperatures to form a titanium nitride (TiN). Alternatively, a diffusion barrier such as titanium-tungsten (TiW) may be provided, e.g. sputtered, on top of the titanium.

The sensor device also comprises a noble metal layer 6 provided over the contact layer 4 such that the contact layer is completely covered by the noble metal layer, for example, arranged over the contact layer at a side of the contact layer that is opposite to the side of the contact layer where the silicon die 2 is arranged.

The contact layer may comprise a diffusion barrier 7 between the noble metal layer 6 and the contact layer 4. Thus, a diffusion barrier 7 may form a surface interface between the noble metal layer 6 and the contact layer 4.

The noble metal layer may comprise palladium and/or platinum, a metal alloy of at least palladium or a metal alloy of at least platinum. For example, the noble metal layer 4 may comprise a stack of a layer of tantalum, e.g. a thin layer of tantalum, and a layer of platinum, palladium or a metal alloy of platinum and/or palladium. The thin layer of tantalum may form an adhesion layer to assure good adhesion of the noble metal to the passivation, e.g. to a silicon oxide and/or silicon nitride of the insulation layer(s) 10, 11.

It is an advantage of the noble metal layer comprising palladium and/or platinum, e.g. comprising platinum, that a good mechanical stability can be achieved, e.g. as compared to other noble metals, such as gold. It is a further advantage that a passivation of the noble metal layer may not be required. For example, a platinum layer with low stress may have good elastic properties that remain stable over time, whereas a gold layer may show plastic deformation under temperature variations or stress variations.

The noble metal layer 6 comprises an interconnect structure and a contact connecting via the contact layer to the ohmic contact. The noble metal layer 6 is patterned to form the interconnect structure and the contact.

The contact may form an ohmic contact to a highly doped silicon region 9 via the contact layer 4 and the silicide 5, e.g. via the barrier 7, the bulk material of the contact layer 4 and the silicide 5.

The noble metal layer may also comprise a bondpad, e.g. may be patterned to form the interconnect structure, the contact and the bondpad.

The noble metal layer is also adapted for providing a shield to prevent modulation of the lowly doped region, e.g. of a piezoresistive element, by surface charges. For example, as shown in FIG. 1, the shield above a stress-sensitive lowly doped region 3 may consist of only the noble metal layer. Thus, for example to achieve a good stability of a piezoresistive element, e.g. with a low drift, the noble metal layer forming the shield may be adapted to have a low stress that does not change substantially over time.

The noble metal layer may also advantageously protect the sensor device, e.g. the contact layer, against harsh media in an external environment of the sensor device.

For example, at least one metallic silicon contact can be fabricated with CMOS technology and a single noble metal layer deposition can be used to cover the contact(s) with palladium, platinum, a metal alloy of at least palladium, a metal alloy of at least platinum or a metal alloy of both. It is an advantage of such metals or alloys that plastic deformation at normal levels of stress that can occur in operation can be avoided. The noble metal layer 6, e.g. a single noble metal layer, may advantageously be used to provide shielding, at least one contact to the silicon and at least one interconnect. Furthermore, the noble metal layer can also be used to define bondpads.

The noble metal layer 6 may have low stresses, as obtainable by thermally treating the noble metal layer to reduce stress. It is an advantage that creep of the noble metal layer can be avoided, which may occur at high stresses.

Local stress in the shielding formed by the noble metal layer could exert a stress on the underlying lowly doped region, which may be susceptible to mechanical stresses. For example, the shielding formed by the noble metal layer 6 may cover a membrane section of the semiconductor die at least partially, e.g. in which a piezoresistor is implemented. Therefore local stress in the shielding structure would exercise an overall stress in the membrane. This overall stress could therefore also result in a signal offset of the sensor.

For example, the sensor device may be adapted for generating a sensor signal, and the stress and creep of the noble metal layer may be sufficiently low to result in a sensor signal offset in the range of 0% to 5%, preferably 0% to 3%, even more preferred 0% to 2%, of the full scale range of the sensor signal provided by the device. Furthermore, a signal offset caused by the stress of the shielding formed by the noble metal layer may change, over a lifetime of the device and in normal use, by a difference in the range of 0.00% to 0.05%, preferably 0.00% to 0.03%, even more preferred 0.00% to 0.02%, of the full scale range of the sensor signal provided by the device.

In other words, a low stress and/or minimal creep of the noble metal layer may refer to material conditions such that the output of the sensor does not show more than 0.05% change of the full scale output over life due to the presence of the shield formed by the noble metal layer.

The noble metal layer 6 completely covers the contact layer 4, e.g. may completely cover the contact layer 4 and the diffusion barrier 7, e.g. such that the contact layer is left unexposed to harsh media in the environment. For example, any part of the surface of the contact layer (or any part of the surface of the combined volume of the contact layer 4 and the barrier 7) may be contiguous to either one of the semiconductor die 2, the insulation layer 10,11 and the noble metal layer 6. Particularly, the noble metal layer 6 may cover sidewalls of the contact layer 4, or the contact layer 4 and the diffusion barrier 7.

In a second aspect, the present invention relates to a method for fabricating a sensor element, the fabricated sensor element being suitable for use in harsh media.

Figure 2:
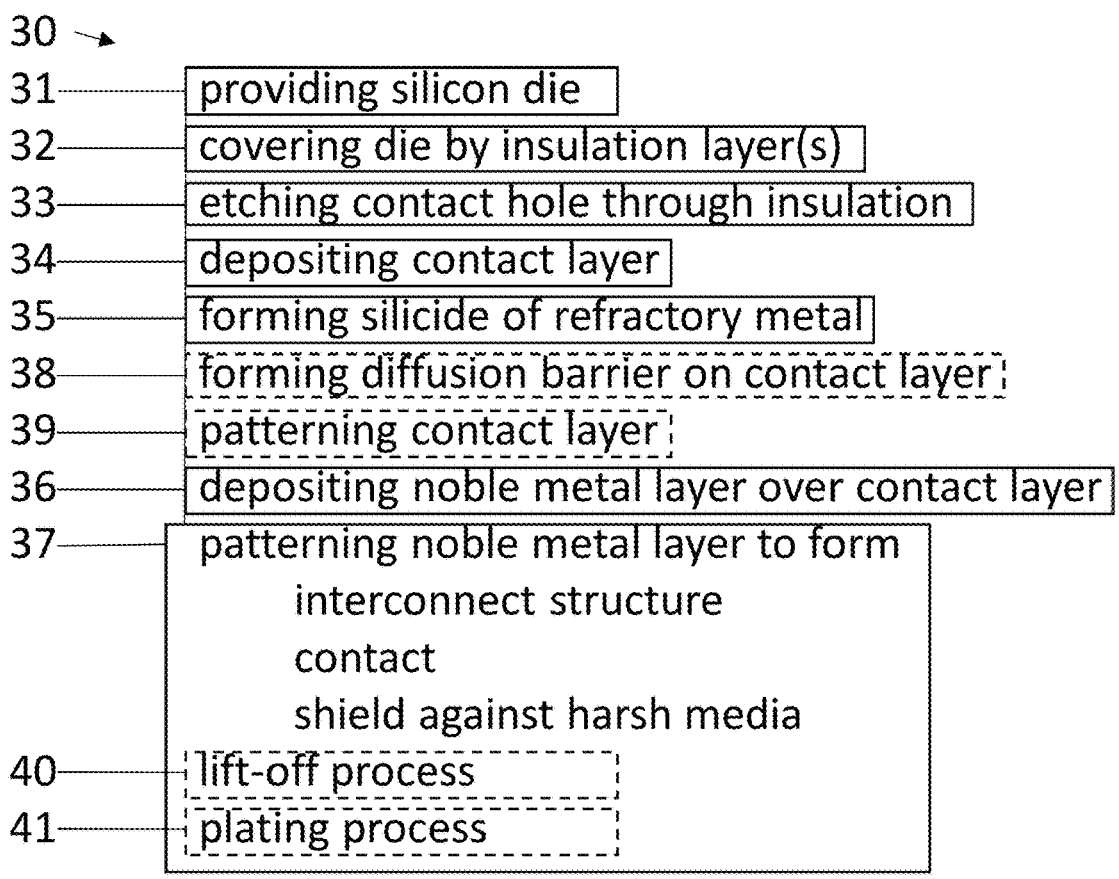
FIG. 2 shows an exemplary method in accordance with embodiments of the present invention.

Referring to FIG. 2, an exemplary method 30 in accordance with embodiments of the present invention is shown.

The method 30 comprises providing 31 a silicon die comprising at least one lowly doped region, e.g. forming at least one piezoresistive element, and a highly doped region. For example, the silicon die may comprise monocrystalline silicon in which piezoresistive sensing elements are realised.

The method 30 comprises covering 32 the semiconductor die by at least one insulation layer that comprises silicon oxide and/or silicon nitride.

The method 30 also comprises etching 33 a contact hole through the at least one insulation layer to expose at least part of the highly doped region.

The method 30 further comprises depositing 34 a contact layer that comprises a refractory metal on the exposed highly doped region, e.g. over and in the contact hole. The contact layer may be suitable as an adhesion layer. The refractory metal may comprise a refractory metal used in standard CMOS processing, as known in the art, such as W, Ti, TiW, TiN, Co, Ni, Mo, Ta or Pd. For example, titanium may be sputtered onto the semiconductor die, e.g. onto the exposed semiconductor die and the insulation layer(s). It is an advantage that such sputtered titanium layer may have good adhesion properties.

The method 30 comprises forming 35 a silicide of the refractory metal, for example a titanium silicide of the deposited titanium, between the contact layer and the silicon of the highly doped region to provide an ohmic contact to the silicon die. The silicide may be created by a heat treatment. The silicide, e.g. a titanium silicide, may be formed in the contact hole at the interface between the contact layer and the highly doped region of the silicon die.

For example, the silicide may be created at the interface between the silicon die and the refractory metal by heating to a temperature, which may lie in the range of 400° C. to 900° C. This temperature treatment may be adapted for providing sufficient energy to the silicon atoms and the refractory metal atoms to react with each other such as to form the silicide. Thus a silicide, such as a TiSi or $Ti_2Si$ silicide, may be created after depositing a titanium layer and heating the titanium. For example, the silicide may be formed only where the metal is sputtered directly on top of the silicon, e.g. may not substantially affect an interface between the contact layer and the insulation layer(s).

The method may also comprise a sputter etch, e.g. prior to depositing the contact layer, to remove native oxides and nitrides from the exposed silicon surface. Thus, when a refractory metal, such as titanium, is sputtered on the silicon wafer having the insulation layer(s), e.g. passivation layer(s), provided thereon, the silicide may be only formed in the contact holes where the passivation is removed and not on the passivation itself.

The method may also comprise forming 38 a diffusion barrier on the contact layer after deposition 34 of the contact layer, for example during the formation 35 of the silicide.

For example, a titanium nitride diffusion barrier may be created on top of a titanium adhesion layer by adding a nitrogen plasma after some point in time during sputtering of the titanium, e.g. during a second half of the titanium sputtering.

However, the diffusion barrier and the adhesive layer may also be sputtered in separate sputter steps with different metals, e.g. to obtain a stack of an adhesion layer and a diffusion barrier.

Furthermore, when no diffusion barrier was formed during sputtering of the contact layer, a diffusion barrier can still be grown, for example by adding nitrogen during an annealing in which the silicide is formed. At typical anneal temperatures, the nitrogen may react with the refractory metal, e.g. with titanium, to form a diffusion barrier.

For example, a TiN layer is an excellent diffusion barrier between the contact area and the metal that is deposited on top of the TiN later in the fabrication process e.g. the noble metal layer.

The method may comprise patterning 39 the contact layer, e.g. patterning the contact layer and the diffusion barrier, before deposition 36 of the noble metal layer, e.g. such that a continuous area of the contact layer remains that overlaps and completely covers the contact hole, e.g. such that the continuous area is larger than the opening of the contact hole and completely covers the contact hole. This continuous area of the contact layer may be smaller than an area footprint of the highly doped region in a plane parallel to the semiconductor die.

For example, the contact layer and the diffusion barrier may be jointly patterned before depositing the noble metal layer that forms an interconnect and shield. Thus, the diffusion barrier between the noble metal layer and the silicon contact via the silicide can be maintained while at the same time preventing exposure of the edge of the contact layer and/or diffusion barrier to the environment. By fully covering the circumference of the contact hole by the contact layer and/or diffusion barrier and fully covering the contact layer and/or diffusion barrier by the noble metal layer, a good protection against corrosion in harsh media environment can be achieved.

The method 30 comprises depositing 36 a noble metal layer over the contact layer such that the contact layer is completely covered by the noble metal layer. This noble metal layer comprises palladium, platinum or a metal alloy of palladium and/or platinum. Thus, the noble metal layer, e.g. a single layer comprising palladium and/or platinum, may be deposited such as to form a low ohmic contact to the highly doped silicon region via the contact layer (e.g. via the diffusion barrier and the refractory metal of the contact layer) and the silicide.

Depositing the noble metal layer may comprise depositing a layer of tantalum, for providing a good adhesion of the platinum and/or palladium to the insulation layer(s), followed by depositing the platinum, palladium or alloy thereof.

For example, noble metals do not strongly bond to non-metallic layers such as passivation materials. However, a strong bond between the insulation layer(s) and the noble metal, e.g. the palladium or platinum, may be advantageous to prevent delamination of the noble metal layer, e.g. which might occur due to a large mismatch of thermal expansion.

Depositing 36 the noble metal layer may comprise depositing the Pa, Pt or alloy thereof (and/or depositing an intermediate adhesion layer, e.g. a tantalum layer) by evaporation, sputtering, chemical vapour deposition or plasma enhanced vapour deposition. Sputtering has the advantage that the metal atoms are sent to the surface with high kinetic energy. This high kinetic energy may provide a good adhesion to the surface. By using a sputtering process, a good low-ohmic contact can be achieved between the noble metal and the contact layer. The sputtering may also provide a good adhesion of the noble metal to the edges of the contact layer and/or diffusion barrier. The adhesion can be further improved by applying a further sputter etch just before sputtering the noble metal layer. During such sputter etch, atoms with high energy are sent to the surface to remove thin layers such as native oxides and to polarize the surface. For example, after the sputter etch, a thin adhesion layer may be sputtered, e.g. the tantalum adhesion layer. The same tool can be used for sputtering the tantalum and the noble metal. The noble metal, e.g. the platinum, palladium and/or alloy thereof, may thus be sputtered after the sputtering of the adhesion layer, without intermediately exposing the wafer to oxygen or nitrogen to prevent the formation of native oxides or nitrides.

The method comprises patterning 37 the noble metal layer to form an interconnect structure and a contact connecting, via the contact layer, to the ohmic contact. The noble metal layer is patterned such that a shield to prevent modulation of the piezoresistive element by surface charges is formed. The noble metal layer may completely cover the contact layer, such as to protect the contact layer from harsh media in the environment of the sensor device.

The noble metal layer may thus be structured such as to define an interconnect and a shield. Furthermore, a bondpad may also be defined by this patterning. Particularly, a good shielding can be achieved by patterning the noble metal layer such that the surface and the sidewalls of the contact layer, e.g. including the diffusion barrier, remain covered by the noble metal layer.

In the patterning process 37, the shield and interconnect (and optionally a bondpad) are formed, and the contacts to the silicon may be encapsulated. When the noble metal layer comprises an adhesion layer, e.g. the tantalum adhesion layer, between the insulation layer(s) and the noble metal, patterning of the noble metal layer may be performed with an additional emphasis on good coverage of the edges. For example, using an etching mask on the noble metal layer, when comprising a stack of an adhesion layer and the noble metal, might result in an exposed edge of the adhesion layer at the bottom of the edges.

Patterning 37 the noble metal layer may comprise applying a lift-off process 40. For example, the noble metal layer may be sputtered as part of a lift-off process wherein the adhesion layer may be fully covered by the noble metal. Such lift-off process may comprise providing a mask with openings, and subsequently sputtering the noble metal layer, e.g. sputtering the tantalum adhesion layer and the noble metal. During sputtering, the sputtered material may be deposited on the wafer only where openings in the mask are defined. Since the adhesion layer is deposited through the same mask openings as the noble metal, the edges of the adhesion layer are covered with the noble metal as much more noble metal than adhesion metal is sputtered through the same lift-off mask openings.

The lift-off process may comprise providing a mask with openings, in which this mask is formed by at least two layers of masking material, e.g. layers of resist, in which at least a second masking material layer 62 creates an overhang on at least a first masking material layer 61 with a length w, as shown in FIG. 3. The first masking material layer may have a height h. The slope of the sputtered layer on the wafer is primarily defined by the ratio of the thickness of the lower masking material layer 61 and the final metal thickness. Also the angle variation of the incoming atoms plays a role and the ratio w/h may be selected as sufficiently large to assure that the sputtered metal does not reach the sidewall of the lower masking material layer 61. By keeping this sidewall free of sputtered material, a good reaction of a lift-off solution with the resist can be assured. Hence, using a lift-off process is a good solution to combine an adhesion material 63, e.g. tantalum, with a noble metal 64, e.g. platinum or palladium, in which the edges of adhesion material are covered by the noble metal.

After sputtering of the noble metal layer, e.g. sputtering the adhesion material and the noble metal, the lift-off process may comprise removing the masking material, e.g. the first and second masking material layer 61, 62, e.g. using a lift-off solution. At the surface of the device, a noble metal structure may thus be created that covers the contacts to the silicon and forms a shield above the lowly doped region, e.g. the piezoresistive element, and forms an interconnect. The noble metal structure may advantageously also be patterned to form a bondpad. As described further hereinbelow, this noble metal layer may have compressive stress that might change over time. A thermal anneal may be performed to reduce the compressive stress to a low value, e.g. to a minimum.

Alternatively, patterning 37 the noble metal layer may comprise applying an electroplating process 41, e.g. such that the contact layer is not exposed. For example, the noble metal, e.g. platinum or palladium, may be deposited by electrodeposition, e.g. in a platinum or palladium electroplating bath, e.g. at 35° C., onto the contact layer, e.g. onto a TiN diffusion barrier of the contact layer. For example, electroplating may allow a good bonding between the noble metal layer and an underlying passivation layer, whereas other plating methods, e.g. electroless plating, disadvantageously might provide a poor bonding of the noble metal layer to an underlying passivation layer.

The method may also comprise a step of applying a heat treatment to minimise the stress in the noble metal layer. It is an advantage that such heat treatment may stabilize the noble metal layer and may reduce, e.g. minimize, creep.

For example, during metal sputtering of the noble metal layer, the kinetic energy of the sputtered atoms can be so high that atoms reaching the wafer surface penetrate in the layer and then push surrounding atoms in lateral direction. As a result the sputtered metal layer may exhibit compressive stress. This stress can be relaxed by heating the wafer at a temperature that gives enough thermal energy to the atoms to re-settle. This can be achieved by applying a bake or rapid thermal annealing at temperatures in the range of 200° C. to 600° C.

The thermal budget may be optimized to prevent that the layer turns from compressive to highly tensile when the layer is exposed to high temperatures for a long time. By applying thermal energy to the layer the compressive stress, created by the penetration of the atoms during sputtering, can be eliminated. However, applying excessive thermal energy may also allow grains to grow which make the layer shrink and therefore could cause high tensile stress. Such optimization of a thermal budget is known in the art, and lies well within the capabilities of the skilled person to determine by straightforward optimization without exerting an inventive effort.

The invention claimed is:

1. A sensor device for use in harsh media, the sensor element comprising:
   a silicon die comprising a lowly doped region;
   a contact layer contacting the silicon die, the contact layer comprising a refractory metal and an ohmic contact to said silicon die via a silicide of said refractory metal; and
   a noble metal layer provided over said contact layer such that the contact layer is completely covered by the noble metal layer, said noble metal layer comprising palladium, platinum or a metal alloy of palladium and/or platinum,
   wherein said noble metal layer is patterned to form an interconnect structure and a contact connecting via said contact layer to said ohmic contact,
   wherein said noble metal layer is adapted for providing a shield for preventing modulation of said lowly doped region by surface charges,
   wherein said noble metal layer is provided over said contact layer such that a top surface of the contact layer and sidewalls of the contact layer are completely covered by the noble metal layer.

2. The sensor device of claim 1, wherein said noble metal layer is treated to acquire low stress and minimum creep.

3. The sensor device of claim 1, wherein said noble metal layer is furthermore patterned to define a bondpad.

4. The sensor device of claim 1, wherein said refractory metal comprises titanium, tungsten, molybdenum and/or tantalum.

5. The sensor device of claim 1, furthermore comprising a diffusion barrier forming a surface interface between the noble metal layer and the contact layer.

6. The sensor device of claim 1, comprising a diffusion barrier forming a surface interface between the noble metal layer and the contact layer, wherein said refractory metal is titanium, wherein said silicide is titanium silicide and wherein said diffusion barrier comprises titanium nitride and/or titanium-tungsten.

7. The sensor device of claim 1, furthermore comprising at least one insulation layer that comprises silicon oxide and/or silicon nitride, said at least one insulation layer being provided in between the lowly doped region and the noble metal layer.

8. The sensor device of claim 7, wherein a contact hole is provided through said at least one insulation layer for connecting the noble metal layer via the contact layer and the silicide to a highly doped region in the silicon die.

9. The sensor device of claim 8, wherein the contact layer comprises a continuous area overlapping and completely covering the contact hole.

10. The sensor device of claim 9, wherein said continuous area of the contact layer is smaller than an area footprint of the highly doped region in a plane parallel to the silicon die.

11. The sensor device of claim 1, wherein said lowly doped region comprises a piezoresistive element.

12. The sensor device of claim 1, wherein said lowly doped region comprises a diffuse p-well in an n-type bulk or a diffuse n-well in a p-type bulk.

13. The sensor device of claim 1, wherein said refractory metal of the contact layer forms an adhesion layer, said silicide arranged between the adhesion layer and the silicon die.

14. A method for fabricating a sensor element for use in harsh media, the method comprising:
   providing a silicon die comprising a lowly doped region and a highly doped region;
   covering the silicon die by at least one insulation layer comprising silicon oxide and/or silicon nitride;
   etching a contact hole through said at least one insulation layer to expose at least part of said highly doped region;
   depositing a contact layer comprising a refractory metal on said exposed highly doped region;
   forming a silicide of the refractory metal between the contact layer and the silicon of the highly doped region to provide an ohmic contact to the silicon die;
   depositing a noble metal layer over said contact layer such that the contact layer is completely covered by the noble metal layer, said noble metal layer comprising palladium, platinum or a metal alloy of palladium and/or platinum; and
   patterning said noble metal layer to form an interconnect structure and a contact connecting via said contact layer to said ohmic contact, such that the patterned noble metal layer forms a shield to prevent modulation of the lowly doped region by surface charges;
   wherein said noble metal layer is provided over said contact layer such that a top surface of the contact layer and sidewalls of the contact layer are completely covered by the noble metal layer.

15. The method of claim 14, comprising forming a diffusion barrier on the contact layer after deposition of the contact layer or during the formation of the silicide.

16. The method of claim 14, in which the contact layer is patterned before deposition of the noble metal layer, such that a continuous area of the contact layer remains that overlaps the contact hole and such that the continuous area of the contact layer is smaller than an area footprint of the highly doped region in a plane parallel to the silicon die.

17. The method of claim 14, wherein patterning said noble metal layer comprises applying a lift-off process.

18. The method of claim 14, wherein patterning said noble metal layer comprises applying an electroplating process.

* * * * *